United States Patent [19]

Takeshiro

[11] Patent Number: 5,695,602
[45] Date of Patent: Dec. 9, 1997

[54] PROCESS OF ETCHING SILICON NITRIDE LAYER BY USING ETCHING GAS CONTAINING SULFUR HEXAFLUORIDE, HYDROGEN BROMIDE AND OXYGEN

[75] Inventor: Shinichi Takeshiro, Tokyo, Japan

[73] Assignee: NEC Corporation, Tokyo, Japan

[21] Appl. No.: 650,983

[22] Filed: May 21, 1996

[30] Foreign Application Priority Data

May 24, 1995 [JP] Japan .................. 7-124976PAT

[51] Int. Cl.$^6$ .................................. H01L 21/00
[52] U.S. Cl. .................. 156/643.1; 156/657.1; 156/659.11; 216/67; 252/79.1
[58] Field of Search .................. 156/643.1, 653.1, 156/646.1, 657.1, 659.11; 216/67; 252/79.1

[56] References Cited

FOREIGN PATENT DOCUMENTS

4275423  10/1992  Japan .

*Primary Examiner*—William Powell
*Attorney, Agent, or Firm*—Whitham, Curtis, Whitham & McGinn

[57] ABSTRACT

A silicon nitride layer on a silicon oxide layer is selectively etched by using etching gas containing sulfur hexafluoride, hydrogen bromide and oxygen, and the hydrogen bromide is large enough in vapor pressure to maintain the composition of the etching gas without a heater.

10 Claims, 10 Drawing Sheets

PROCESS OF ETCHING SILICON NITRIDE LAYER BY USING ETCHING GAS CONTAINING SULFUR HEXAFLUORIDE, HYDROGEN BROMIDE AND OXYGEN

FIELD OF THE INVENTION

This invention relates to a process of etching a silicon nitride layer and, more particularly, to a process of etching a silicon nitride layer in gaseous etchant containing sulfur hexafluoride, hydrogen bromide and oxygen.

DESCRIPTION OF THE RELATED ART

Figure 1A:
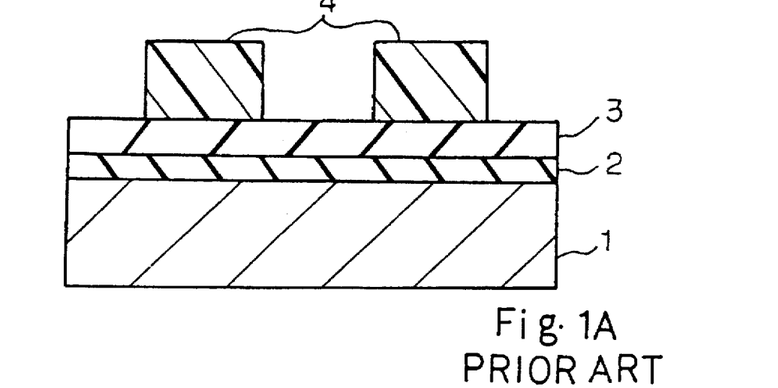
FIGS. 1A to 1C are cross sectional views showing the prior art process sequence.
Figure 1B:
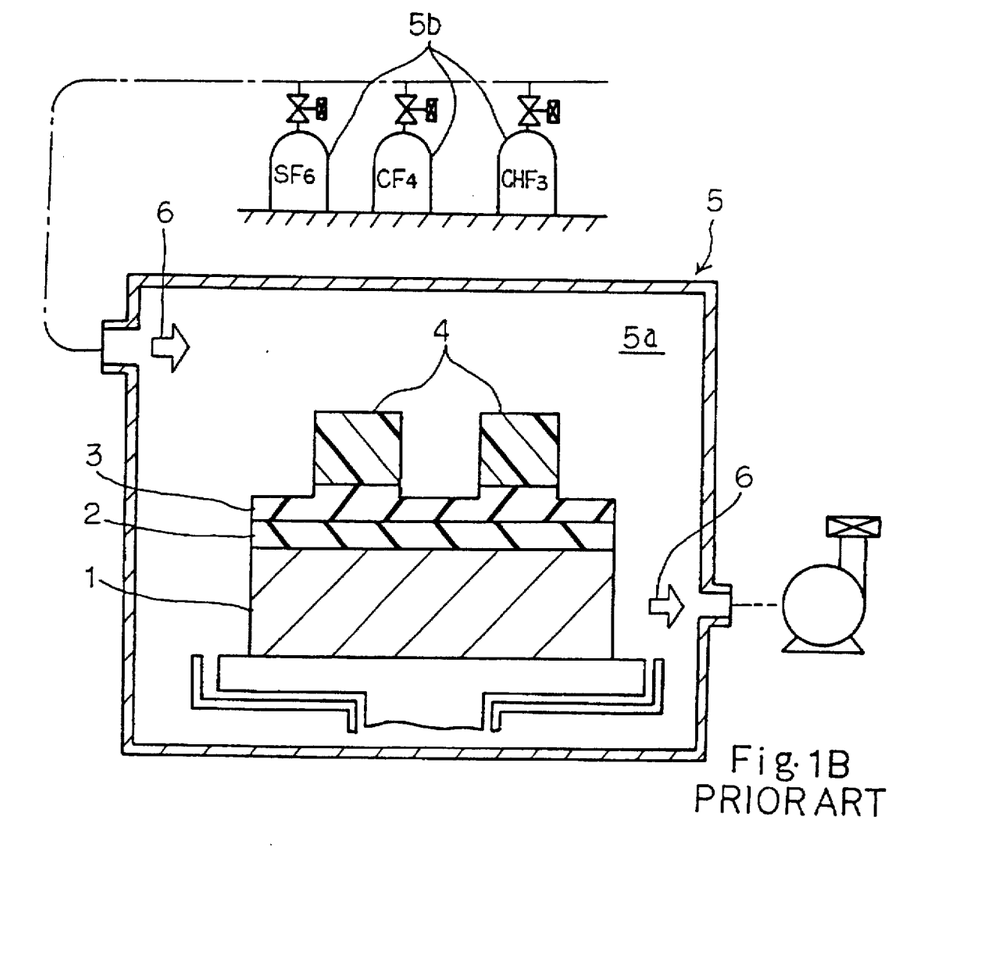
Figure 1C:
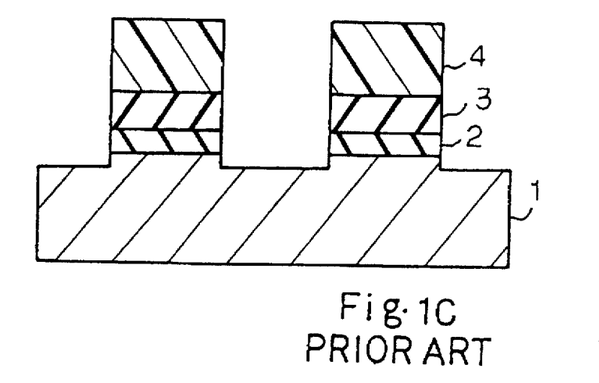

An ultra large scale integration requires precisely pattern transfer technologies, and FIGS. 1A to 1C illustrates a prior art process of patterning a silicon nitride layer. A silicon substrate 1 is firstly prepared, and a surface portion of the silicon substrate 1 is thermally oxidized so as to grow a silicon oxide layer 2. Silicon nitride is deposited over the entire surface of the silicon oxide layer 2, and the silicon oxide layer 2 is overlain by a silicon nitride layer 3.

Photo-resist is spread over the entire surface of the silicon nitride layer 3, and a photo-resist layer is formed on the silicon nitride layer 3. A pattern image is optically transferred to the photo-resist layer, and the photo-resist layer is developed to a photo-resist mask 4. The silicon nitride layer 3 is partially covered with the photo-resist mask 4 and partially uncovered, and a resultant laminated structure is shown in FIG. 1A.

The resultant laminated structure is placed in a chamber 5a of a dry etching system. Etching gas 6 is supplied from a gas supply sub-system 5b to the chamber 5a, an is evacuated from the chamber 5a to the outside.

The gas etchant contains sulfur hexafluoride expressed as $SF_6$, carbon tetrafluoride expressed as $CF_4$ and methine trifluoride expressed as $CHF_3$, and etches away the silicon nitride layer 3 uncovered with the photo-resist mask 4 as shown in FIG. 1B.

The dry etching is carried out until the silicon oxide layer 2 is exposed, and the laminated structure is taken out from the chamber 5a.

However, the selectivity of the etching gas is of the order of 3 between the silicon nitride and the silicon oxide. Therefore, the silicon oxide layer 2 hardly stops the etching gas, and the etching gas is liable to etch the silicon substrate 1 as shown in FIG. 1C.

Japanese Patent Publication of Unexamined Application No. 4-275423 discloses etching gas large in selectivity between the silicon nitride and the silicon oxide. The Japanese Patent Publication of Unexamined Application proposes the gas etchant containing sulfur hexafluoride and boron tribromide. The gaseous mixture of sulfur hexafluoride and boron tribromide is larger in selectivity than the gaseous mixture of sulfur hexafluoride, carbon tetrafluoride and methine trifluoride, and the silicon oxide layer 2 can serve as an etching stopper.

Figure 2:
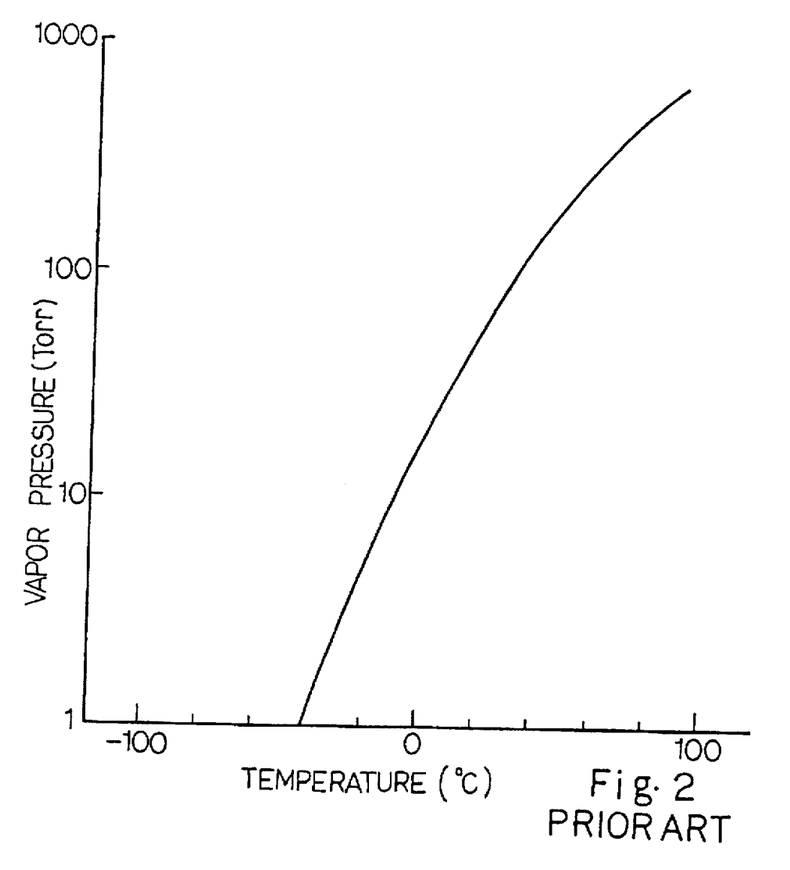
FIG. 2 is a graph showing the relation between the vapor pressure of boron tribromide and temperature.

However, a problem is encountered in the prior art process using the gaseous mixture of sulfur hexafluoride and boron tribromide in reproducibility of etching rate and the safety. As shown in FIG. 2, the boron tribromide has a low vapor pressure in a practical temperature range, and, accordingly, is liable to be liquefied in the gas supply sub-system. Although the gas supply sub-system heated over 60 degrees in centigrade theoretically prevents the boron tribromide from the liquefaction, the boron tribromide is unstable, and is partially liquefied. The liquefaction changes the flow rate of boron tribromide in the etching gas, and deteriorates the reproducibility. Moreover, the liquefied boron tribromide tends to clog the gas supply sub-system, and is causative of trouble.

Figure 3A:
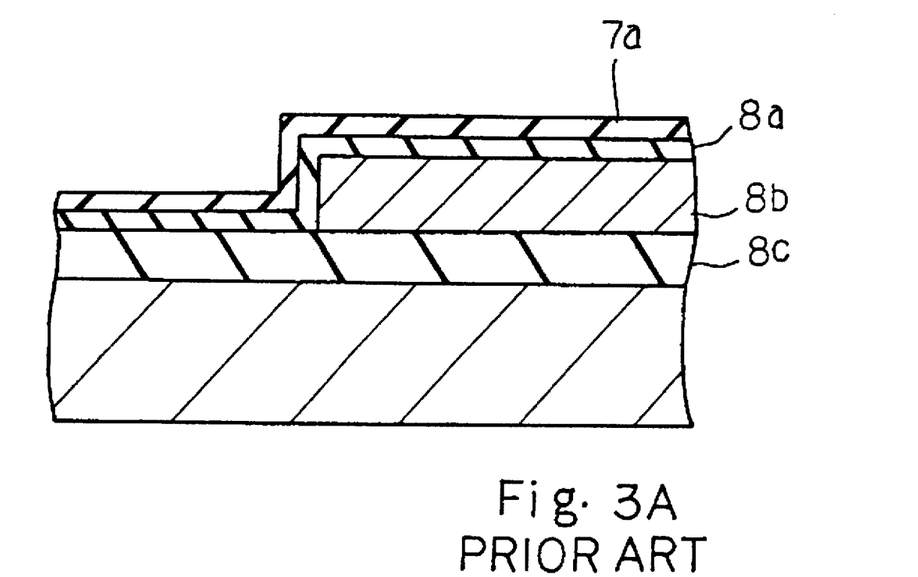
FIGS. 3A and 3B are cross sectional views showing the problem inherent in the prior art process.
Figure 3B:
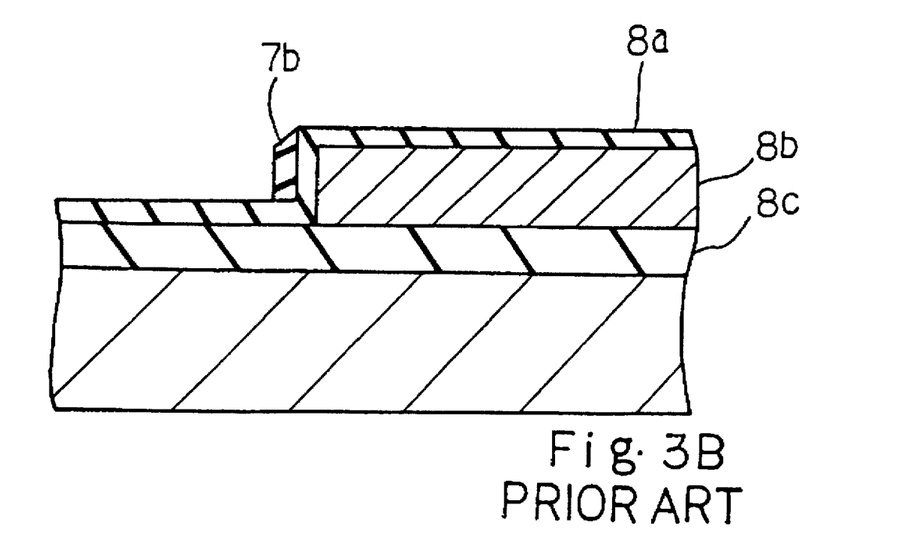

Another problem is the anisotropy. Of course, the anisotropy is desirable for forming a sharp edge. However, when a silicon nitride layer 7a to be removed extends along a step portion of an upper silicon oxide layer 8a due to a patterned polysilicon strip 8b on a lower silicon oxide layer 8c (see FIG. 3A), the anisotropic etching results in an undesirable residual piece of silicon nitride 7b at the vertical wall of the step portion as shown in figure 3B. Thus, the etching gas containing the sulfur hexafluoride and the boron tribromide does not isotropically removes the silicon nitride layer 7a.

SUMMARY OF THE INVENTION

It is therefore an important object of the present invention to provide a process of etching a silicon nitride layer which is improved in selectively, reproducibility and safety.

To accomplish the object, the present invention proposes to use an etchant containing sulfur hexafluoride, hydrogen bromide and oxygen.

In accordance with the present invention, there is provided a process of etching a silicon nitride layer, comprising the steps of: a) preparing a multiple-layer structure including a lower layer of a substance and an upper layer formed of silicon nitride on the lower layer; and b) exposing the upper layer to an etching gas containing sulfur hexafluoride, hydrogen bromide and oxygen so as to etch the upper layer.

The lower layer may be formed of silicon oxide, and the upper layer may be partially covered with an etching mask.

BRIEF DESCRIPTION OF THE DRAWINGS

The features and advantages of the process of etching a silicon nitride layer according to the present invention will be more clearly understood from the following description taken in conjunction with the accompanying drawings in which.

DESCRIPTION OF THE PREFERRED EMBODIMENTS

First Embodiment

Figure 4A:
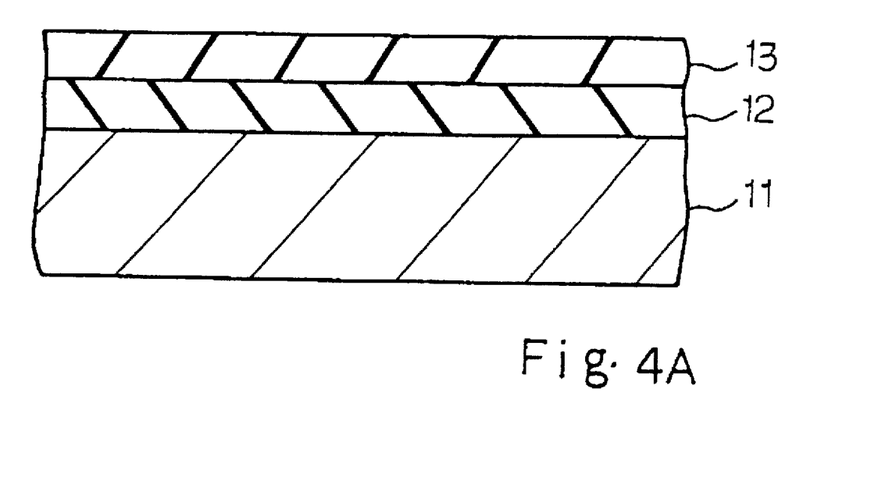
FIGS. 4A to 4D are cross sectional views showing a process sequence for etching a silicon nitride layer according to the present invention.

FIGS. 4A to 4D illustrates essential steps of a process of patterning a silicon nitride layer embodying the present invention. The process starts with preparation of a silicon substrate 11, and a surface portion of the silicon substrate 11 is thermally oxidized. Silicon oxide is grown to 10 nanometers thick, and the silicon substrate 11 is overlain by a silicon oxide layer 12. Subsequently, silicon nitride is deposited to 10 nanometers thick over the entire surface of the silicon oxide layer 12 by using a chemical vapor deposition, and the silicon oxide layer 12 is overlain by a silicon nitride layer 13 as shown in FIG. 4A. The silicon oxide may be deposited by using a chemical vapor deposition. In this instance, the silicon substrate 11, the silicon oxide layer 12 and the silicon nitride layer as a whole constitute a multiple-layer structure.

Figure 4B:
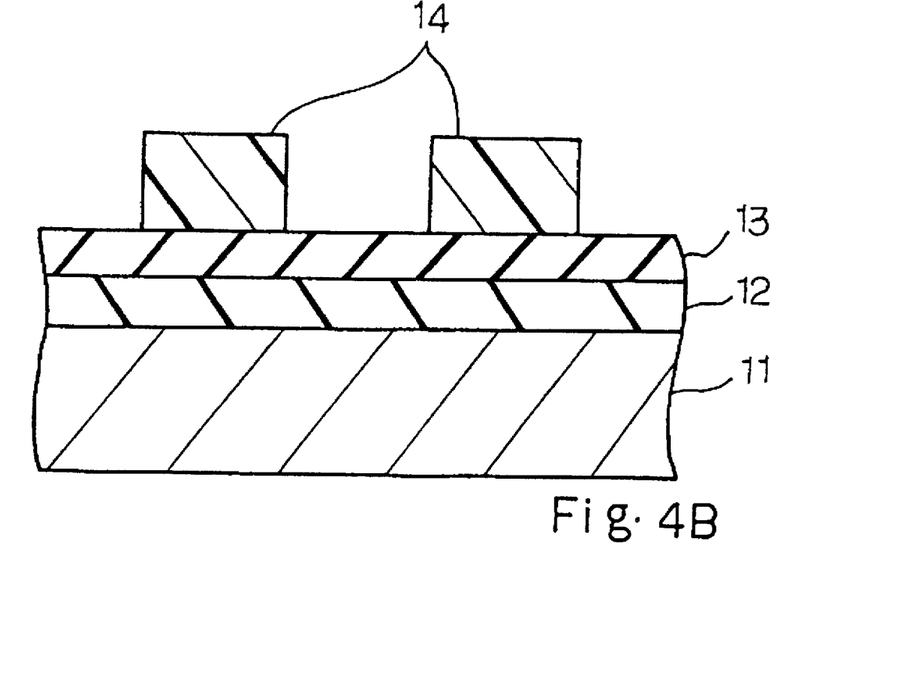

Subsequently, photo-resist is spread over the entire surface of the silicon nitride layer 13, and the silicon nitride layer 13 is overlain by a photo-resist layer. The multiple-layer structure is placed on a stage of an aligner, and a pattern image is optically transferred to the photo-resist layer. The photo-resist layer is developed, and a photo-resist etching mask 14 is provided on the silicon nitride layer 13 as shown in FIG. 4B.

Figure 4C:
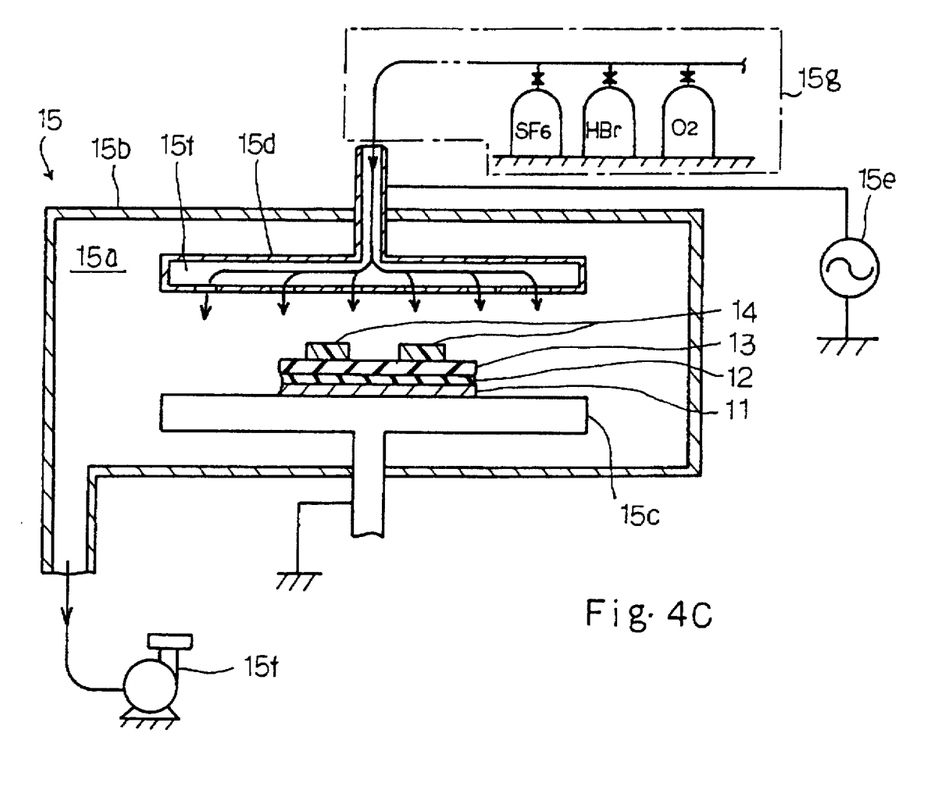

The multiple-layer structure is placed in a vacuum chamber 15a of an anode-coupled parallel-plate reactive ion etching system 15 as shown in FIG. 4C. A reactor 15b defines the vacuum chamber 15a, and cathode plate 15c and an anode plate 15d are provided in the vacuum chamber 15a. The cathode plate 15c is grounded, and is opposed to the anode plate 15d. The anode plate 15d is connected to an rf power source 15e, and a gas conduit 15f is formed in the anode plate 15d. A gas supply sub-system 15g is connected to the gas conduit 15f, and etching gas is supplied from the gas supply sub-system 15g through the gas conduit 15f to the vacuum chamber 15a. The vacuum chamber 15a is further connected to a vacuum pump 15h, and the vacuum pump 15f develops vacuum in the vacuum chamber 15a.

The etching gas contains sulfur hexafluoride expressed as $SF_6$, hydrogen bromide expressed as HBr and oxygen. The hydrogen bromide of the etching gas ranges from 3 percent to 10 percent by volume. If the hydrogen bromide is less than 3 percent, the selectivity of the etching gas is insufficient. On the other hand, if the hydrogen bromide is greater than 10 percent, the dispersion of the etching speed is too large on the upper surface of the silicon nitride layer 13.

Figure 5:
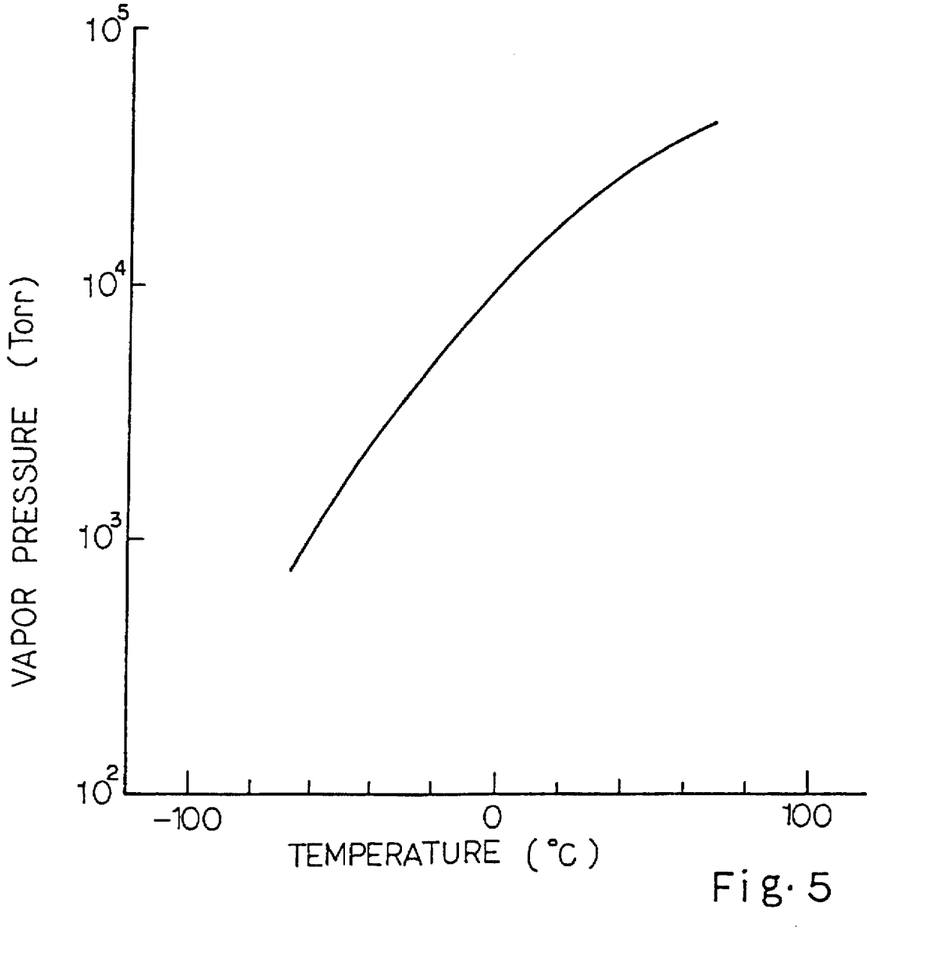
FIG. 5 is a graph showing the vapor pressure of hydrogen bromide in terms of temperature.

The hydrogen bromide is larger in vapor pressure than the boron tribromide as shown in FIG. 5. Even through a heater is not provided for the gas supply sub-system 15g, the hydrogen bromide is not liquefied, and does not clog the gas pipe and the gas conduit 15f. Thus, the etching gas is stable and safety by virtue of the hydrogen bromide.

The vacuum pump 15f evacuates the air in the vacuum chamber 15a, and the etching gas is supplied form the gas supply sub-system 15g to the vacuum chamber 15a. The flow rate of the sulfur hexafluoride, the flow rate of the hydrogen bromide and the flow rate of the oxygen are respectively regulated to 200 sccm, 15 sccm and 10 sccm, and the vacuum pump 15f maintains the vacuum chamber at 850 milli-torr. The rf power source 15e supplies alternating current at 13.56 MHz, and the electric power is regulated to 150 watts.

Figure 4D:
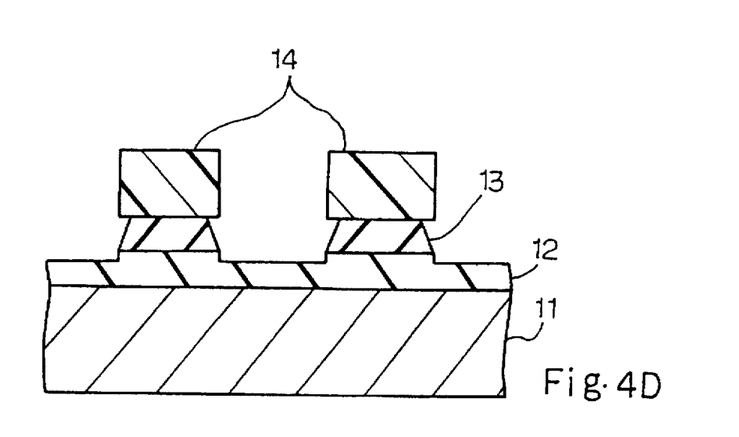

The photo-resist etching mask 14 partially exposes the silicon nitride layer 13 to the etching gas, and the etching is isotropically carried out until the silicon oxide layer 12 is exposed. The etching rate to the silicon nitride is 40 nanometers per minute, and the etching gas etches the silicon oxide at 5 nanometers per minute. Therefore, the selectivity of the etching gas is 8, and is large enough to selectively etch the silicon nitride layer 13 on the silicon oxide layer 12. For this reason, even if the etching gas excessively etches the multiple-layer structure, the silicon substrate 11 is never exposed as shown in FIG. 4D.

Finally, the photo-resist etching mask 14 is stripped off from the multiple-layer structure.

FIGS. 6A to 6D illustrate the process sequence applied to a multiple-layer structure having a step portion. The process starts with preparation of a silicon substrate 21, and a silicon oxide layer 22 is deposited on a major surface of the silicon substrate 21. Polysilicon is deposited on the silicon oxide layer 22, and the polysilicon layer is patterned into an accumulating electrode 23 by using lithographic techniques.

Figure 6A:
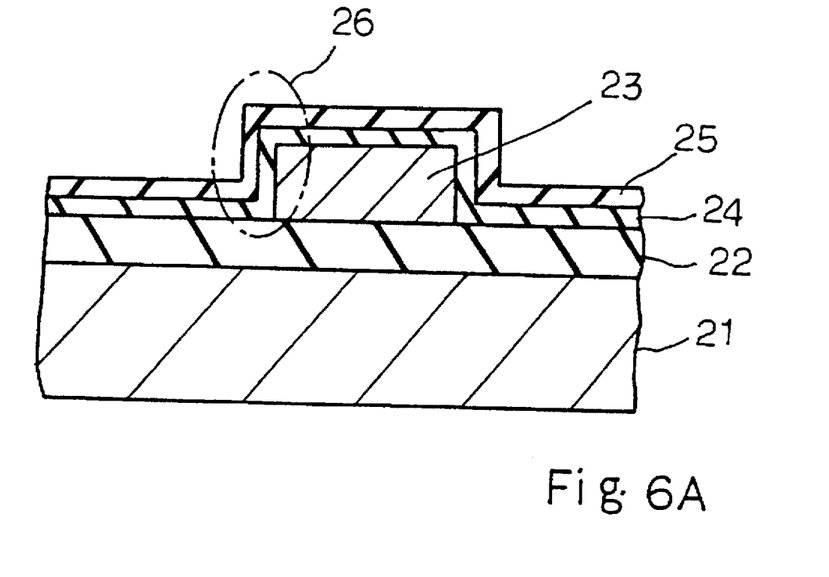
FIGS. 6A to 6D are cross sectional views showing the process according to the present invention applied to another semiconductor structure.

Silicon oxide is deposited to 10 nanometers thick over the entire surface of the resultant structure by using a chemical vapor deposition, and a silicon oxide layer covers the accumulating electrode 23 and the silicon oxide layer 22 extending on both sides of the accumulating electrode 23.

Subsequently, silicon nitride is deposited to 10 nanometers thick over the silicon oxide layer 24 by using a chemical vapor deposition, and the silicon oxide layer 24 is overlain by a silicon nitride layer 25. The side surface of the accumulating electrode 23 and the silicon oxide layer 22 form a step portion, and the step configuration is transferred through the silicon oxide layer 24 to the silicon nitride layer 25 as encircled by dot-and-dash line 26 as shown in FIG. 6A. The silicon substrate 21, the silicon oxide layer 22, the accumulating electrode 23, the silicon oxide layer 24 and the silicon nitride layer 25 as a whole constitute a multiple-layer structure.

Photo-resist is spread over the entire surface of the silicon nitride layer 25, and the silicon nitride layer 25 is overlain by a photo-resist layer. A pattern image is optically transferred to the photo-resist layer, and the photo-resist layer is developed into a photo-resist etching mask 27 as shown in FIG. 6B.

Figure 6B:
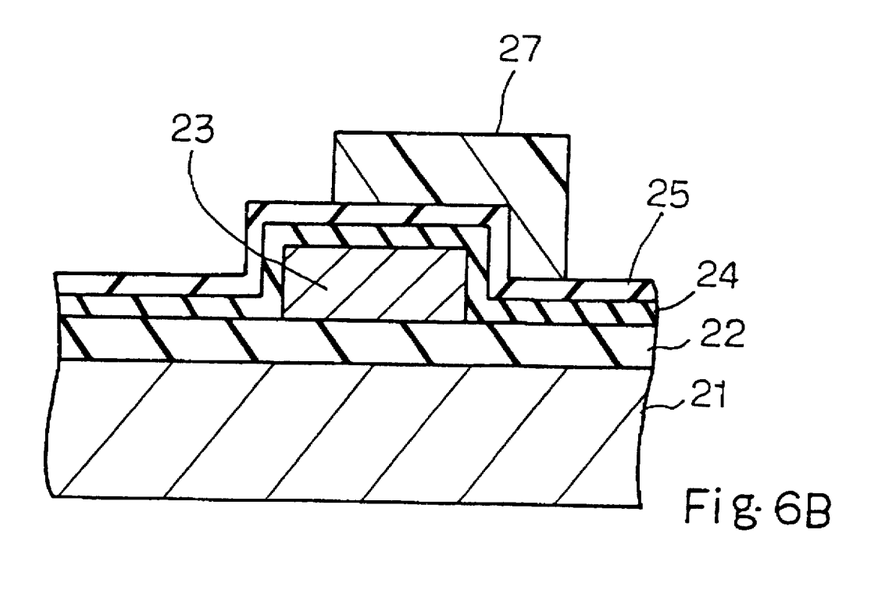
Figure 6C:
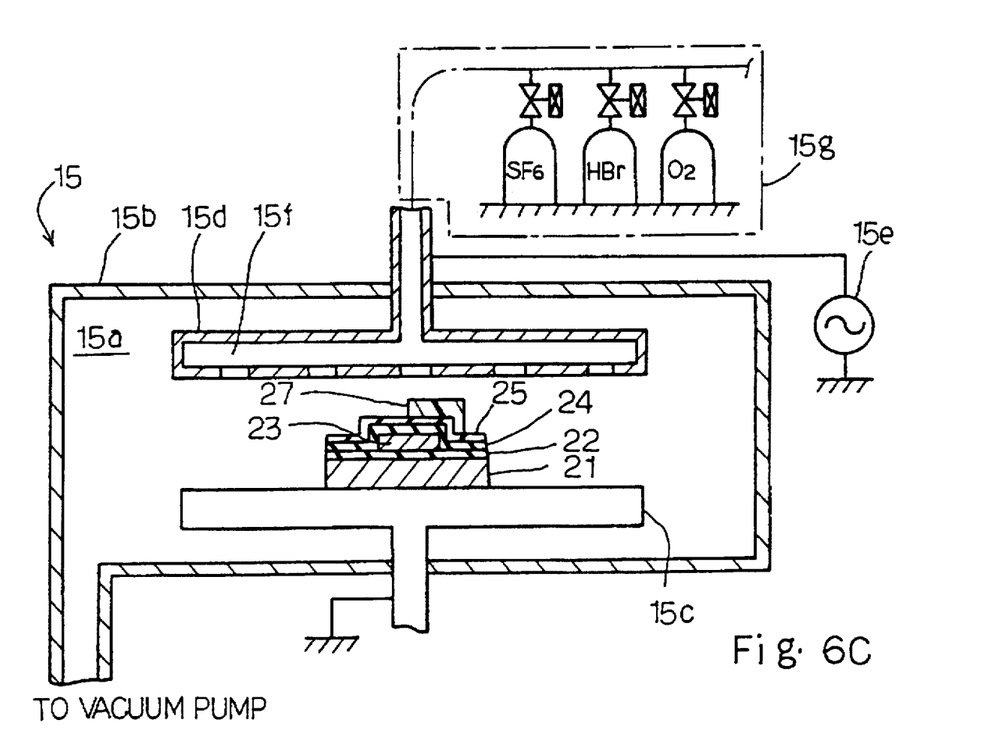

The resultant structure shown in FIG. 6B is placed on the cathode plate 15c of the anode-coupled parallel-plate reactive ion etching system 15 as shown in FIG. 6C.

Figure 6D:
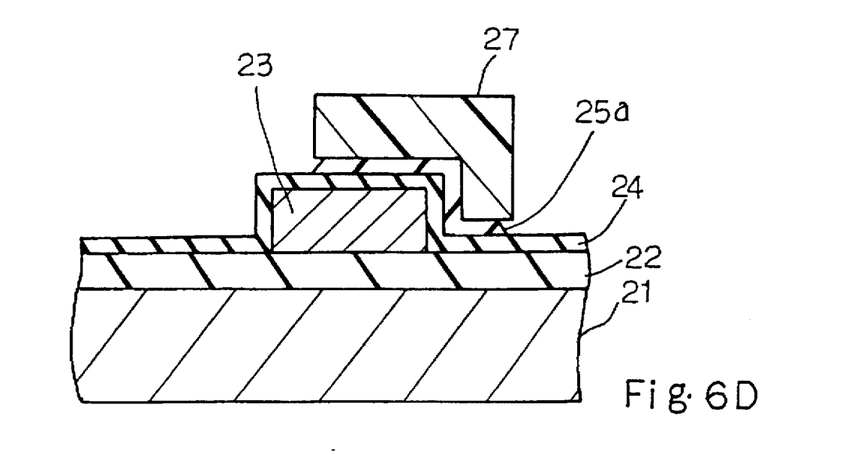

The isotropic dry etching is carried out under the same conditions as described hereinbefore, and the silicon nitride layer 25 uncovered with the photo-resist etching mask 27 is removed from the multiple-layer structure as shown in FIG. 6D. The isotropy results in a silicon nitride strip 25a beneath the photo-resist etching mask 27 without a residual piece at the step portion.

The photo-resist etching mask 27 is stripped off, and a counter electrode is finally formed in such a manner as to be opposite to the accumulating electrode 23.

As will be understood from the foregoing description, the hydrogen bromide has a large vapor pressure, and causes the etching gas to selectively etch the silicon nitride layer 13 under the large selectivity to the silicon oxide. For this reason, the process of patterning a silicon nitride layer according to the present invention achieves a miniature silicon nitride pattern. Moreover, the etching gas isotropically patterns the silicon nitride layer under the above described etching conditions.

Second Embodiment

FIGS. 7A to 7D illustrate another process of patterning a silicon nitride layer embodying the present invention. The process starts with preparation of a silicon substrate 31, and a surface portion of the silicon substrate 31 is thermally oxidized. A silicon oxide layer 32 is grown to 10 nanometers thick over the silicon substrate 31. The silicon oxide layer 32 may be deposited by using the chemical vapor deposition.

Figure 7A:
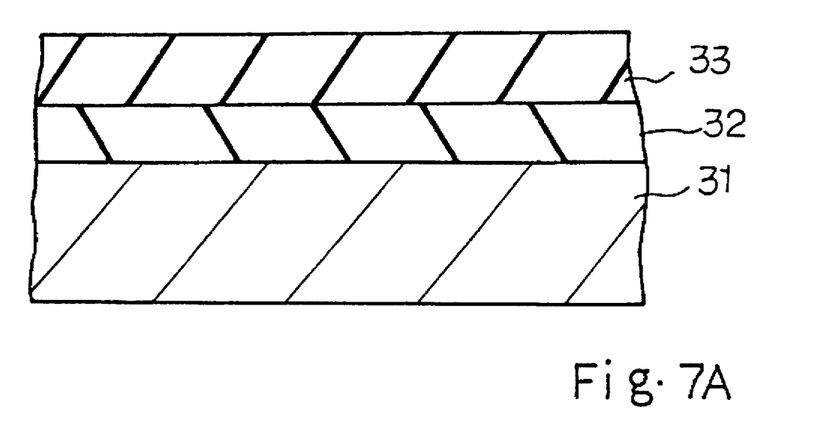
FIGS. 7A to 7D are cross sectional views showing another process of patterning a silicon nitride layer according to the present invention.

Silicon nitride is deposited to 150 nanometers thick over the entire surface of the silicon oxide layer 32, and the silicon oxide layer 32 is overlain by a silicon nitride layer 33 as shown in FIG. 7A. The silicon substrate 31, the silicon oxide layer 32 and the silicon nitride layer 33 as a whole constitute a multiple-layer structure.

Photo-resist is spread over the entire surface of the silicon nitride layer 33, and the silicon nitride layer 33 is overlain by a photo-resist layer. A pattern image is optically transferred to the photo-resist layer, and the photo-resist layer is developed into a photo-resist etching mask 34 as shown in FIG. 7B.

Figure 7B:
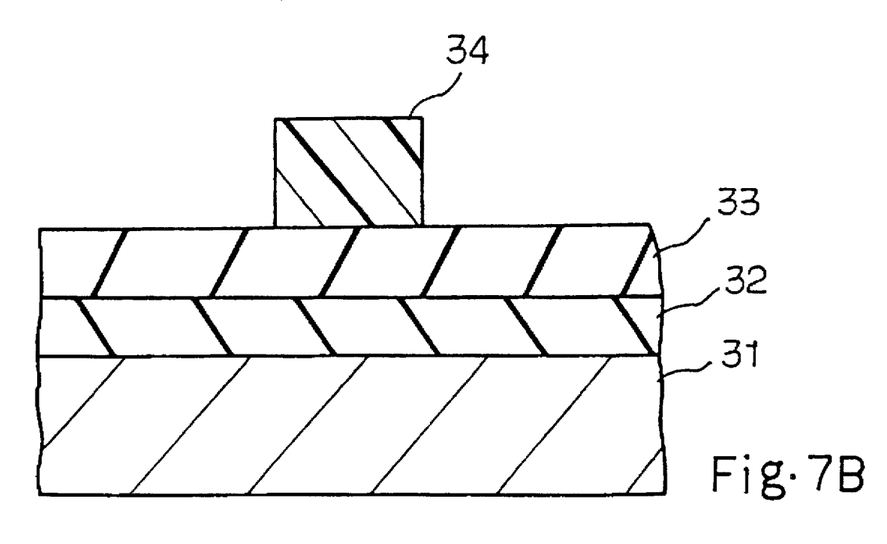
Figure 7C:
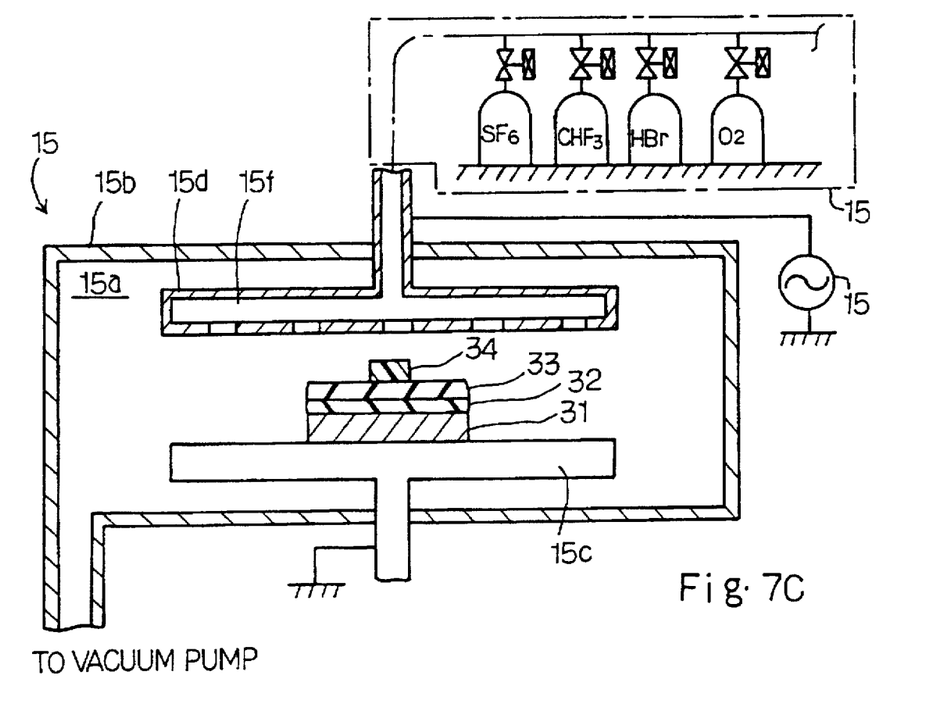

The resultant structure shown in FIG. 7B is placed on the cathode plate 15c of the anode-coupled parallel-plate reactive ion etching system 15 as shown in FIG. 7C.

An anisotropic etching is firstly carried out. The anisotropic etching conditions are regulated as follows. The flow rate of the sulfur hexafluoride and the flow rate of the methine trifluoride ($CHF_3$) are 50 sccm and 5 sccm, respectively, and the vacuum chamber 15a is maintained at 300 milli-torr. The radio frequency is regulated to 13.56 MHz, and the rf power source 15e applies 250 watts to the anode plate 15d. The etching gas anisotropically removes the silicon nitride layer 33 exposed thereto, and the etching rate to the silicon nitride and the etching rate to the silicon oxide are 180 nanometers per minute and 60 nanometers per minute, respectively. Therefore, the selectivity between the silicon nitride and the silicon oxide is 3. The etching time is controlled by using an etching end point detector (not shown). The anisotropic etching forms sharp edges of a silicon nitride strip 33a on the silicon oxide layer 32. However, residual silicon nitride pieces are left on the multi-layer structure due to a dispersion of the etching speed.

Figure 7D:
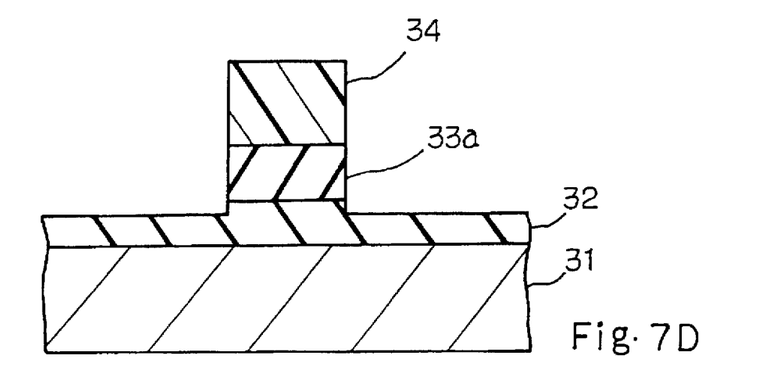

For this reason, the isotropic etching is carried out by using the etching gas containing the sulfur hexafluoride, the hydrogen bromide and the oxygen. The isotropic etching conditions are as follows. The flow rate of the sulfur hexafluoride, the flow rate of the hydrogen bromide and the flow rate of the oxygen are respectively regulated to 200 sccm, 15 sccm and 10 sccm, and the vacuum pump maintains the vacuum chamber 15a at 850 milli-torr. The rf power source 15e supplies alternating current at 13.56 MHz, and the electric power is regulated to 150 watts. The isotropic etching removes the residual silicon nitride pieces from the multiple-layer structure without etching the silicon oxide layer 32 as shown in FIG. 7D.

Finally, the photo-resist etching mask 34 is stripped off, and the silicon nitride strip 33a is left on the silicon oxide layer 32.

Thus, even if the silicon nitride layer 33 is much thicker than the silicon oxide layer 32, the thick silicon nitride layer 33 is patterned into the silicon nitride strip 33a without a residual silicon nitride piece by using the combination of the anisotropic etching and the isotropic etching according to the present invention.

As will be appreciated from the foregoing description, the etching gas containing the sulfur hexafluoride, the hydrogen bromide and the oxygen isotropically etches a silicon nitride layer with a large selectivity. The hydrogen bromide has a large vapor pressure, and is not liquefied without a heater. For this reason, the etching gas is safety and stable in composition.

Although particular embodiments of the present invention have been shown and described, it will be obvious to those skilled in the art that various changes and modifications may be made without departing from the spirit and scope of the present invention.

Any substance is available in so far as the substance is smaller in etching rate than the silicon nitride.

The silicon nitride layer may be uniformly etched without an etching mask for making up a hole or recess. For this reason, an etching mask is not a indispensable feature of the present invention.

What is claimed is:

1. A process of etching a silicon nitride layer, comprising the steps of:
   a) preparing a multiple-layer structure including a lower layer of a substance and an upper layer formed of silicon nitride on said lower layer; and
   b) exposing said upper layer to an etching gas containing sulfur hexafluoride, hydrogen bromide and oxygen so as to etch said upper layer.

2. The process as set forth in claim 1, in which said substance is silicon oxide.

3. The process as set forth in claim 1, further comprising the step of forming an etching mask on said upper layer between said step a) and said step b) so as to expose a part of said upper layer to said etching gas in said step b).

4. The process as set forth in claim 1, in which said substance is silicon oxide, and said hydrogen bromide ranges from 3 percent to 10 percent by volume of said etching gas.

5. The process as set forth in claim 4, further comprising the step of forming an etching mask on said upper layer between said step a) and said step b) so as to expose a part of said upper layer to said etching gas in said step b).

6. The process as set forth in claim 1, in which said step b) is carried out in an anode-coupled parallel-plate reactive ion etching system.

7. The process as set forth in claim 1, in which said substance is silicon oxide, and said hydrogen bromide ranges from 3 percent to 10 percent by volume of said etching gas supplied to an anode-coupled parallel-plate reactive ion etching system where said multiple-layer structure is placed.

8. The process as set forth in claim 7, further comprising the step of forming an etching mask on said upper layer between said step a) and said step b) so as to expose a part of said upper layer to said etching gas in said step b).

9. The process as set forth in claim 8, further comprising the step of anisotropically patterning said upper layer between said step of forming said etching mask and said step b), and residual pieces of said upper layer is removed in said step b).

10. The process as set forth in claim 2, further comprising the step of forming an etching mask on said upper layer between said step a) and said step b) so as to expose a part of said upper layer to said etching gas in said step.

* * * * *